United States Patent
Nishiyama et al.

(10) Patent No.: US 7,701,114 B2
(45) Date of Patent: Apr. 20, 2010

(54) SURFACE ACOUSTIC WAVE DEVICE

(75) Inventors: Kenji Nishiyama, Yasu (JP); Takeshi Nakao, Omihachiman (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/326,235

(22) Filed: Dec. 2, 2008

(65) Prior Publication Data

US 2009/0072659 A1      Mar. 19, 2009

Related U.S. Application Data

(63) Continuation of application No. PCT/JP2007/060412, filed on May 22, 2007.

(30) Foreign Application Priority Data

Jun. 16, 2006   (JP) .............................. 2006-167304

(51) Int. Cl.
*H03H 9/25* (2006.01)
(52) U.S. Cl. .................... 310/313 A; 333/193; 333/194
(58) Field of Classification Search ............. 310/313 A; 333/193, 194
See application file for complete search history.

(56) References Cited

U.S. PATENT DOCUMENTS

| 5,432,392 | A | 7/1995 | Kadota et al. |
| 5,814,917 | A | 9/1998 | Isobe et al. |
| 6,037,847 | A | 3/2000 | Ueda et al. |
| 6,317,015 | B1 | 11/2001 | Ueda et al. |
| 6,426,584 | B2 | 7/2002 | Yoshida et al. |
| 7,230,365 | B2 | 6/2007 | Nishiyama et al. |
| 7,310,027 | B2 * | 12/2007 | Kando ........................ 333/133 |
| 7,339,304 | B2 | 3/2008 | Kadota et al. |
| 7,411,334 | B2 | 8/2008 | Nishiyama et al. |

(Continued)

FOREIGN PATENT DOCUMENTS

JP    10-126208 A    5/1998

OTHER PUBLICATIONS

Official Communication issued in International Patent Application No. PCT/JP2007/060412, mailed on Aug. 21, 2007.

*Primary Examiner*—Thomas M Dougherty
(74) *Attorney, Agent, or Firm*—Keating & Bennett, LLP

(57) ABSTRACT

A surface acoustic wave device has a duty that is greater than about 0.5, attenuation outside the pass band is increased, and an undesirable spurious response is effectively suppressed. The surface acoustic wave device includes an $LiNbO_3$ substrate having Euler angles $(0°\pm5°, \theta\pm5°, 0°\pm10°)$, an electrode that is provided on the $LiNbO_3$ substrate and that includes an IDT electrode primarily made of Cu, a first silicon oxide film that is provided in an area other than an area in which the electrode is arranged so as to have a thickness substantially equal to that of the electrode, and a second silicon oxide film that is arranged so as to cover the electrode and the first silicon oxide film, wherein the surface acoustic wave device utilizes an SH wave, wherein a duty D of the IDT electrode 3 is at least about 0.52, and $\theta$ of the Euler angles $(0°\pm5, \theta+5°, 0°\pm10°)$ is set so as to fall within a range that satisfies the following Inequality (1A) or (1B):

(1) When $0.52 \leq D \leq 0.6$, $-10 \times D+92.5-100 \times C \leq \theta \leq 37.5 \times D^2 - 57.75 \times D + 104.075 + 5710 \times C^2 - 1105.7 \times C + 45.729$     Inequality (1A)

(2) When $D>0.6$, $86.5-100 \times C \leq \theta \leq 37.5 \times D^2 - 57.75 \times D + 104.075 + 5710 \times C^2 - 1105.7\lambda C + 45.729$     Inequality (1B)

where D is a duty, and C is a thickness of the IDT.

9 Claims, 6 Drawing Sheets

U.S. PATENT DOCUMENTS

| | | |
|---|---|---|
| 7,418,772 B2 | 9/2008 | Nishiyama et al. |
| 7,446,453 B1 * | 11/2008 | Naumenko et al. ...... 310/313 A |
| 7,471,027 B2 * | 12/2008 | Kando .................... 310/313 A |
| 2006/0071579 A1 | 4/2006 | Kando |
| 2007/0096592 A1 * | 5/2007 | Kadota et al. ........... 310/313 A |

* cited by examiner

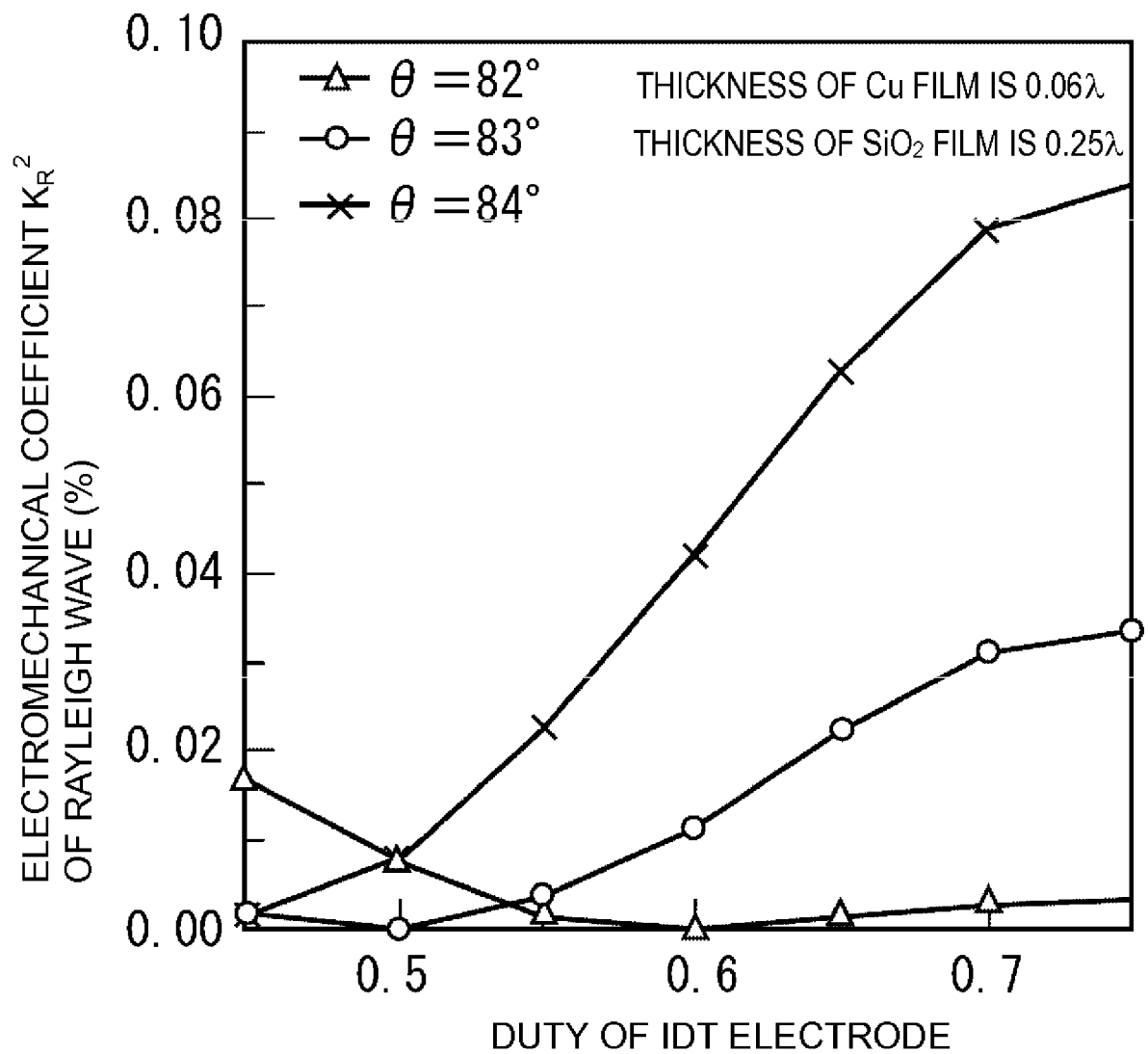

SURFACE ACOUSTIC WAVE DEVICE

BACKGROUND OF THE INVENTION

1. Field of the Invention

The present invention relates to a surface acoustic wave device that is used, for example, as a resonator or a band-pass filter and, more particularly, to a surface acoustic wave device that includes an IDT electrode and a silicon oxide film provided on an $LiNbO_3$ substrate and that utilizes an SH wave.

2. Description of the Related Art

A band-pass filter used in an RF stage of a cellular phone, or other suitable device, must have a wide band and desirable temperature characteristic. Thus, the related art utilizes a surface acoustic wave device such that an IDT electrode is provided on a piezoelectric substrate made of a Y-rotated X-propagating $LiTaO_3$ substrate or a Y-rotated X propagating $LiNbO_3$ substrate and a silicon oxide film is arranged so as to cover the IDT electrode. The piezoelectric substrate of this type has a negative frequency-temperature coefficient. Thus, in order to improve the temperature characteristic, a silicon oxide film having a positive frequency-temperature characteristic is arranged so as to cover the IDT electrode.

However, with the structure described above, when the IDT electrode is made of Al or an alloy that primarily includes Al, which are typically used, the IDT electrode has not been able to attain a sufficient reflection coefficient. Thus, there has been a problem that a ripple tends to occur in the resonance characteristic.

To solve the above-described problem, WO2005-034347 discloses a surface acoustic wave device including an IDT electrode made of a metal having a density that is greater than that of Al that is provided on a piezoelectric substrate made of $LiNbO_3$ having an electromechanical coefficient $K^2$ of at least about 0.025, a first silicon oxide film is provided in the area, other than the area in which the IDT electrode is provided, so as to have a thickness substantially equal to the electrode, and a second silicon oxide film is laminated so as to cover the electrode and the first silicon oxide film.

In the surface acoustic wave device described in WO2005-034347, the density of the IDT electrode is greater than or equal to about one and half times the density of the first silicon oxide film, and, therefore, the reflection coefficient of the IDT electrode is sufficiently increased to thereby suppress a ripple that occurs in the resonance characteristic.

In addition, in WO2005-034347, a Rayleigh wave is utilized and Au, Cu, or other suitable material, is used as the electrode material. The structure in which the electrode made of Cu has a thickness of about $0.0058\lambda$ to about $0.11\lambda$ is described. In this case, the $LiNbO_3$ substrate having Euler angles of ($0°\pm5°$, $62°$ to $167°$, $0°\pm10°$), and preferably, ($0°\pm5°$, $88°$ to $117°$, $0°\pm10°$), is described, and the thickness of the second silicon oxide film and ranges from about $0.15\lambda$ to about $0.4\lambda$ where $\lambda$ is the wavelength of a surface wave.

In the surface acoustic wave device described in WO2005-034347, when $\theta$ of the Euler angles of the $LiNbO_3$ substrate, the thickness of the electrode made of Cu and the thickness of the second silicon oxide film are set so as to fall within the specific ranges described above, it is possible to increase the electromechanical coefficient of a mode to be used, and it is possible to reduce the electromechanical coefficient of a mode that becomes a spurious response.

That is, WO2005-034347 describes that it is only necessary that the Euler angles of the $LiNbO_3$ substrate are set so as to reduce the electromechanical coefficient of the mode that becomes a spurious response.

However, for example, when a surface acoustic wave filter device is used as a duplexer of a cellular phone, the transmission-side filter is required to increase attenuation in the pass band of the reception-side filter, which is the filter at the other side. Thus, in order to increase attenuation in the pass band at the other side, a method of varying a duty of the IDT electrode is known.

That is, usually, the duty of the IDT electrode is set to about 0.5. However, there is a case in which the duty is increased to greater than about 0.5 in order to increase attenuation in the specific frequency band. In the surface acoustic wave device described in WO2005-034347, the Euler angles of the $LiNbO_3$ substrate, which reduce the electromechanical coefficient of the mode that becomes a spurious response is described. However, when the duty of the IDT electrode is varied as described above, even when the Euler angles described in WO2005-034347 are selected, a spurious response may still be too large. That is, in the surface acoustic wave device described in WO2005-034347, the duty of the IDT electrode has not been considered.

In addition, depending on the conditions under which the surface acoustic wave device is manufactured, a spurious response has occurred due to variations in the size of each electrode finger in the width direction.

SUMMARY OF THE INVENTION

To overcome the problems described above, preferred embodiments of the present invention provide a surface acoustic wave device, in which an IDT electrode primarily made of Cu is provided on an $LiNbO_3$ substrate, which has a relatively large electromechanical coefficient of a mode to be used even when a duty is varied from about 0.5, and which has a sufficiently small electromechanical coefficient of a mode that becomes a spurious response.

A surface acoustic wave device according to a preferred embodiment of the present invention includes an $LiNbO_3$ substrate having Euler angles ($0°\pm5°$, $\theta\pm5°$, $0°\pm10°$), an electrode that is provided on the $LiNbO_3$ substrate and that includes an IDT electrode primarily made of Cu, a first silicon oxide film that is provided in an area other than an area in which the electrode is provided so as to have a thickness substantially equal to that of the electrode, and a second silicon oxide film that is arranged so as to cover the electrode and the first silicon oxide film, wherein the surface acoustic wave device utilizes an SH wave, wherein a duty D of the IDT electrode is at least about 0.52, and $\theta$ of the Euler angles ($0°\pm5$, $\theta\pm5°,0°\pm10°$) is set so as to fall within a range that satisfies the following Inequality (1A) or (1B):

(1) when $0.52 \leq D \leq 0.6$, $(-10 \times D)+92.5-(100 \times C) \leq \theta \leq (37.5 \times D^2)-(57.75 \times D)+104.075+(5710 \times C^2)-(1105.7 \times C)+45.729$  Inequality (1A)

(2) when $D>0.6$, $86.5-(100 \times C) \leq \theta \leq (37.5 \times D^2)-(57.75 \times D)+104.075+(5710 \times C^2)-1105.7\lambda C+45.729$  Inequality (1B)

where D is a duty, and C is a thickness of the IDT electrode normalized by a wavelength $\lambda$.

In the surface acoustic wave device according to this preferred embodiment, the IDT electrode primarily made of Cu is provided on the $LiNbO_3$ substrate, and the first and second silicon oxide films are provided. Thus, in the surface acoustic wave device that utilizes an SH wave, it is possible to reduce the absolute value of the frequency-temperature coefficient to thereby improve the temperature characteristic. In addition, the duty of the IDT electrode is set so as to be at least about 0.52. Thus, it is possible to increase the attenuation of the high-band side. Thus, for example, when used as a transmission filter in a duplexer of a cellular phone, it is possible to increase attenuation in the pass band of the reception filter, which is the pass band at the other side.

In addition, because θ of the Euler angles of the LiNbO$_3$ substrate is set so as to fall within the range of Inequality (1A) or (1B) in consideration of the duty D, it is possible to reduce the electromechanical coefficient $K_R^2$ of a Rayleigh wave that becomes a spurious response. Thus, it is possible to obtain a desirable resonance characteristic or filter characteristic in which an SH wave is utilized and a spurious response is suppressed.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 5 is a view that, when, on an LiNbO$_3$ substrate having Euler angles (0°, θ, 0°), an IDT electrode made of Cu having a thickness of about 0.06λ is provided, first and second silicon oxide films are provided, and the thickness of the second silicon oxide film is set so as to be about 0.25λ, shows a relationship among θ of the Euler angles, a duty of the IDT electrode, and an electromechanical coefficient $K_R^2$ of a Rayleigh wave.

DETAILED DESCRIPTION OF PREFERRED EMBODIMENTS

Hereinafter, specific preferred embodiments of the present invention will be described with reference to the accompanying drawings.

Figure 1A:
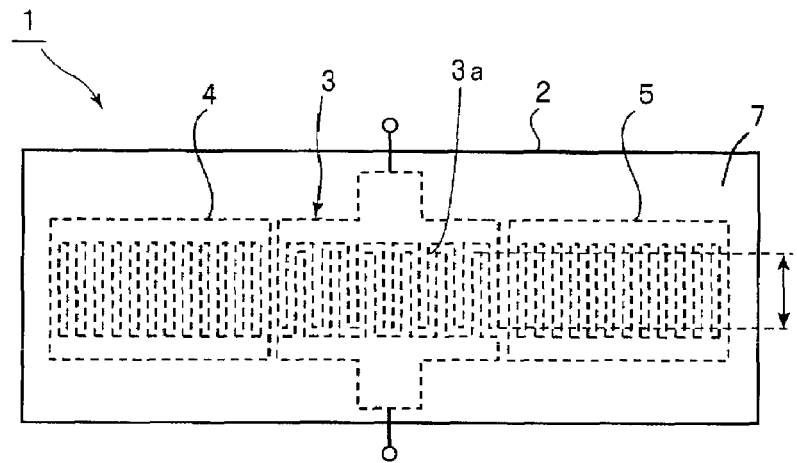
FIG. 1A is a schematic plan view of a surface acoustic wave device according to a preferred embodiment of the present invention.
Figure 1B:
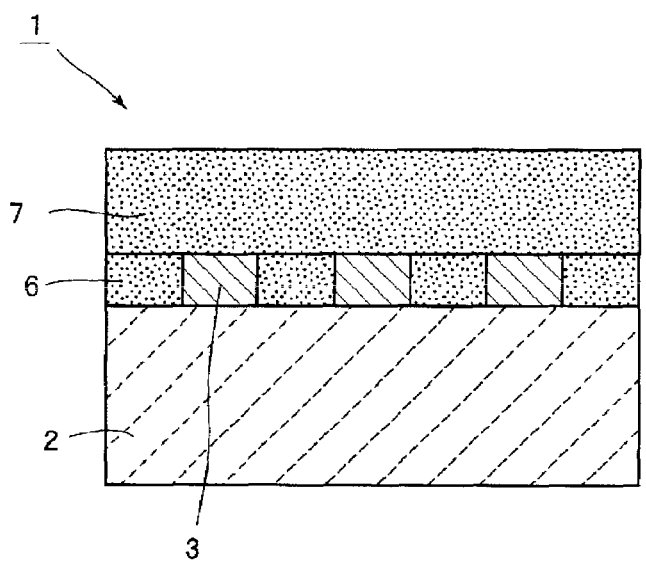
FIG. 1B is a partially enlarged front cross-sectional view that shows a relevant portion of the surface acoustic wave device shown in FIG. 1A.

FIG. 1A is a schematic plan view of a surface acoustic wave device according to a preferred embodiment of the invention, and FIG. 1B is a partially enlarged front cross-sectional view that shows a relevant portion of the surface acoustic wave device.

The surface acoustic wave device 1 includes a Y-rotated X-propagating LiNbO$_3$ substrate 2. The crystal orientation of the LiNbO$_3$ substrate 2 is (0°±5°, θ, 0°±10°) in Euler angles.

In addition, an IDT electrode 3 is provided on the LiNbO$_3$ substrate 2, as shown in FIG. 1B. As shown in FIG. 1A, reflectors 4 and 5 are arranged on both sides of the IDT electrode 3 in a surface acoustic wave propagating direction in which a surface acoustic wave propagates.

In the remaining area other than the areas in which the electrode is provided, a first silicon oxide film 6 is provided. The thickness of the first silicon oxide film 6 is set so as to be substantially equal to the thickness of the IDT electrode 3 and the thickness of each of the reflectors 4 and 5. Then, a second silicon oxide film 7 is arranged so as to cover the electrodes 3 and 4 and the first silicon oxide film 6.

In the surface acoustic wave device 1, the LiNbO$_3$ substrate has a negative frequency-temperature coefficient. In contrast, the silicon oxide films 6 and 7 have a positive frequency-temperature coefficient. Thus, it is possible to improve the frequency characteristic.

In the present preferred embodiment, the IDT electrode 3 is made of Cu having a density of about 8.93 g/cm$^3$. On the other hand, the first silicon oxide film has a density of about 2.21 g/cm$^3$.

Thus, as described in WO2005-034347, it is possible to increase the reflection coefficient of the IDT electrode 3. By doing so, a ripple occurring in the resonance characteristic is effectively suppressed.

Figure 2:
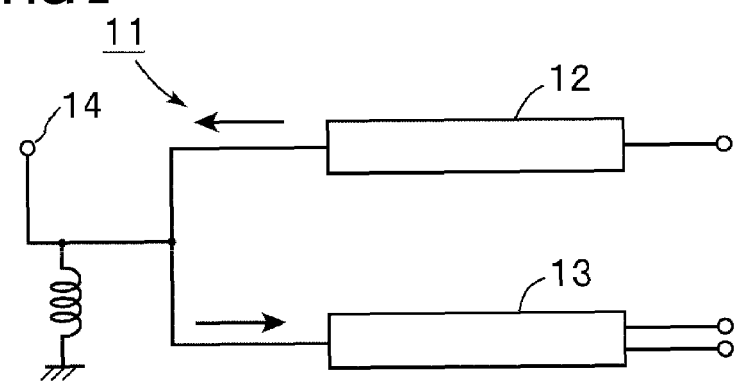
FIG. 2 is a block diagram that shows the circuit configuration of a duplexer of a cellular phone.

In the present preferred embodiment, a plurality of the surface acoustic wave devices 1, which function as one-port surface acoustic wave resonators, are used, so that a transmission filter 12 of a duplexer 11 shown in FIG. 2 is provided. Note that in the duplexer 11, the transmission filter 12 and a reception filter 13 are connected to an antenna-side input terminal 14.

The circuit configuration of the transmission filter 12 is not specifically limited, and it may preferably be a structure in which a plurality of one-port surface acoustic wave resonators, such as the surface acoustic wave devices 1, are connected in a ladder circuit configuration.

The transmission filter described above was manufactured using the plurality of surface acoustic wave devices 1. In this case, each surface acoustic wave device 1, which functions as the one-port surface acoustic wave resonator, was manufactured in accordance with the following specifications.

An IDT made of Cu having a thickness of about 108 nm was formed on a 171.5 degrees Y-rotated X-propagating LiNbO$_3$ substrate, that is, an LiNbO$_3$ substrate having Euler angles (0°, 81.5, 0°). The thickness of a silicon oxide film made of SiO$_2$ on the IDT was set to about 459 nm. Furthermore, an SiN film is deposited on the uppermost layer to adjust the frequency. By adjusting the thickness of the SiN film or etching by RIE or ion milling after deposition, it is possible to adjust the frequency to a desired frequency. In the present experimental example, the thickness of the SiN film after frequency adjustment was set to about 15 nm. Note that the transmission filter has a ladder circuit configuration, and includes a serial arm resonator and a parallel arm resonator. The serial arm resonator and the parallel arm resonator have different resonance frequencies. In addition, resonance frequencies usually vary slightly among a plurality of serial arm resonators, and resonance frequencies usually vary slightly among a plurality of parallel arm resonators. Thus, because a wavelength λ in the serial arm resonators and in the parallel arm resonators is not constant, a normalized thickness of the electrode made of Cu or a normalized thickness of SiO$_2$ also vary accordingly. In the present experimental example, λ was set within a range of about 1.76 μm to about 1.89 μm, a normalized thickness h/λ of the Cu film was set within a range of about 0.057 to about 0.061, and a normalized thickness h/λ of an SiO$_2$ was set within a range of 0.244 to 0.260.

Figure 3:
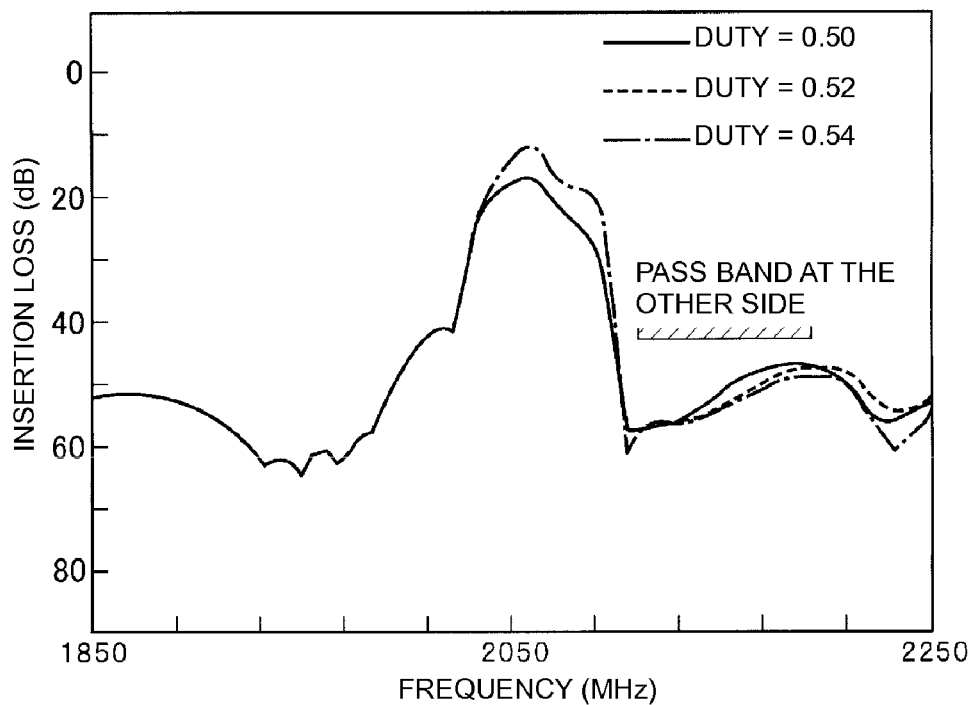
FIG. 3 is a view that shows the frequency characteristics of a transmission-side filter of a WCDMA duplexer and is a view that shows the frequency characteristics when the duties of IDT electrodes are about 0.50, about 0.52 and about 0.54, respectively.
Figure 4:
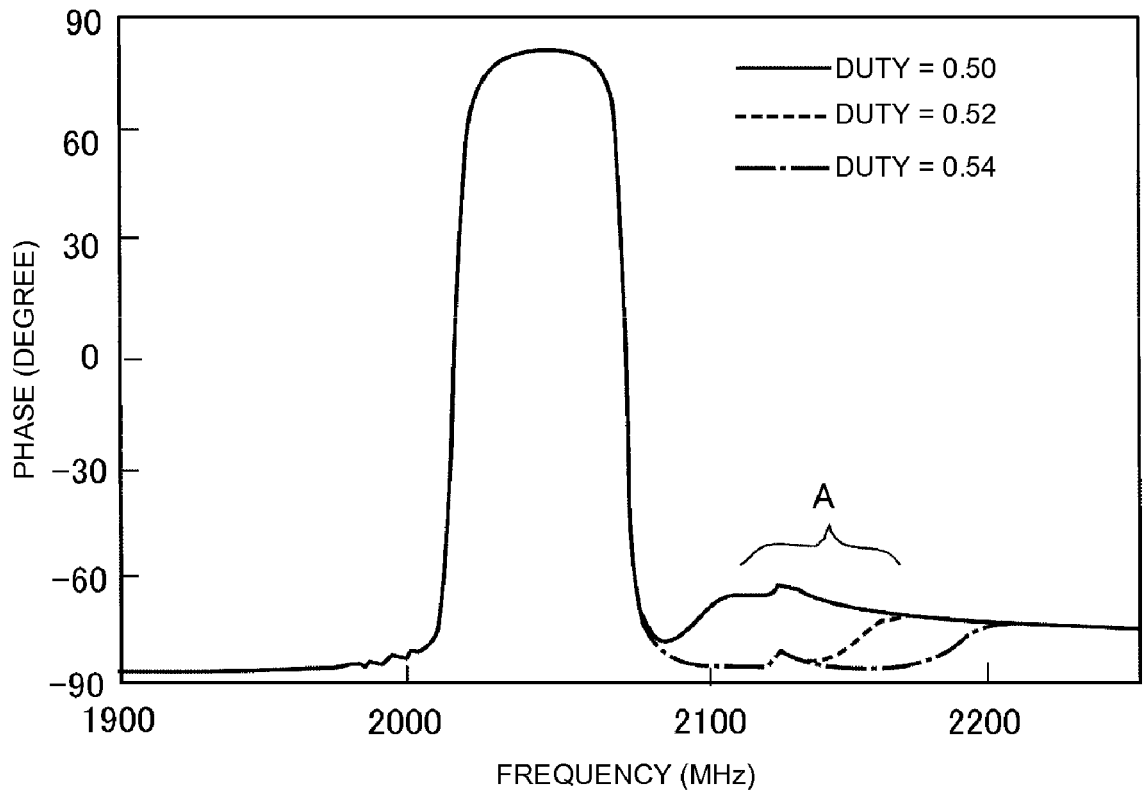
FIG. 4 is a view that shows the phase-frequency characteristic of the surface acoustic wave device shown in FIG. 1A, which functions as a one-port surface acoustic wave resonator, used to define a transmission-side filter in the WCDMA duplexer.

In the surface acoustic wave device 1, the duty was set to about 0.50, about 0.52, or about 0.54. Then, the frequency characteristics of the transmission filters including the surface acoustic wave devices 1 of the respective duties were measured. The results are shown in FIG. 3 and FIG. 4. FIG. 3 shows the frequency characteristic of the transmission filter. FIG. 4 shows the phase characteristic of a one-port surface acoustic wave resonator used in the transmission filter.

As shown in FIG. 3, it appears that, when the duty is about 0.5, attenuation in the pass band of the reception filter, which is the other side filter, within the frequency band greater than the pass band of the transmission filter, that is, in the band of about 2110 MHz to about 2170 MHz, is relatively small and the isolation characteristic is deteriorated. On the other hand, as shown in FIG. 4, a raised portion in phase indicated by reference sign A appears at the high-frequency side of a main response. This is due to the bulk wave, and this causes a deterioration of the isolation characteristic as described above.

In contrast, as shown in FIG. 3, it appears that, when the duty is set so as to be greater than about 0.50, attenuation in the band greater than the pass band is sufficiently large, that is, the isolation characteristic may be improved. Particularly, it appears from FIG. 3 that when the duty is set so as to be at least about 0.52, the isolation characteristic may be effectively improved.

Thus, the duty of the IDT electrode is preferably set so as to be at least about 0.52. Thus, when the transmission filter of the duplexer of the cellular phone is configured in this manner, it is possible to effectively improve the isolation characteristic. However, in the surface acoustic wave device according to preferred embodiments of the present invention, if the duty of the IDT electrode is set to at least about 0.52, as compared to the case in which the duty is about 0.50, it is possible to increase attenuation of various bands other than the pass band. That is, the surface acoustic wave device according to preferred embodiments of the present invention is not limited to use as the transmission filter of the duplexer.

Note that the bulk wave that causes the isolation characteristic to be deteriorated as shown in FIG. 3 and FIG. 4 is not influenced by a surface condition of the piezoelectric substrate. A location at which the raised portion occurs in the phase characteristic is determined based on the wavelength of the bulk wave. In the present preferred embodiment, when the duty is set to at least about 0.52, an interval in frequency between a main response and a bulk wave is increased. Thus, the isolation characteristic is improved. That is, when the duty is set to at least about 0.52, an interval between a frequency of the main response that utilizes an SH wave and a frequency of the bulk wave is increased.

However, in order to improve the isolation characteristic, when the duty is set so as to be greater than about 0.5, a relatively large spurious response caused by a response of a Rayleigh wave occurs.

In contrast, in the present preferred embodiment, θ of the Euler angles of the LiNbO$_3$ substrate is set so as to fall within a range that satisfies the following Inequality (1A) or (1B), so that it is possible to effectively suppress a spurious response based on a Rayleigh wave when an SH wave is utilized. This will be further specifically described.

(1) when $0.52 \leq D \leq 0.6$, $(-10 \times D) + 92.5 - (100 \times C) \leq \theta \leq (37.5 \times D^2) - (57.75 \times D) + 104.075 + (5710 \times C^2) - (1105.7 \times C) + 45.729$  Inequality (1A)

(2) when $D > 0.6$, $86.5 - (100 \times C) \leq \theta \leq (37.5 \times D^2) - (57.75 \times D) + 104.075 + (5710 \times C^2) - 1105.7 \lambda C + 45.729$  Inequality (1B)

where D is a duty, and C is a normalized thickness of the IDT electrode by a wavelength λ.

FIG. 5 shows a relationship between a duty of the IDT electrode and an electromechanical coefficient $K_R^2$ of a Rayleigh wave that becomes a spurious response for a surface acoustic wave device including IDT electrode made of Cu having a thickness of about 0.06λ that is provided on the LiNbO$_3$ substrate having about 82 degrees, about 83 degrees, or about 84 degrees for θ of the Euler angles (0°, θ, 0°), an SiO$_2$ film made of Cu having substantially the same thickness as that of the IDT electrode that is provided as a first silicon oxide film, and an SiO$_2$ film having a thickness of about 0.25λ that is provided as a second silicon oxide film so as to cover the IDT electrode and the first silicon oxide film.

Note that the results shown in FIG. 5 to FIG. 7, which will be described later, are calculated through a finite element method based on the calculation model shown in FIG. 8. As shown in FIG. 8, a surface acoustic wave device including an IDT electrode 22 and a first silicon oxide film 23 that are provided on an LiNbO$_3$ substrate 21 having an infinite thickness, and a second silicon oxide film 24 that is provided thereon was used as the model.

As shown in FIG. 5, when θ is about 82°, and the duty is about 0.5, the electromechanical coefficient $K_R^2$ of a Rayleigh wave is less than or equal to about 0.04%. However, as the duty decreases from about 0.5, the electromechanical coefficient $K_R^2$ of a Rayleigh wave increases and, therefore, a spurious response caused by the Rayleigh wave cannot be ignored.

On the other hand, when θ is about 83° or θ is about 84°, and the duty is about 0.5, the electromechanical coefficient $K_R^2$ of a Rayleigh wave is less than or equal to about 0.02%. However, it appears that as the duty increases from about 0.5, the electromechanical coefficient of a Rayleigh wave significantly increases. Thus, it appears from FIG. 5 that when the duty is greater than about 0.5, it is necessary to adjust θ of the Euler angles.

Figure 6A:
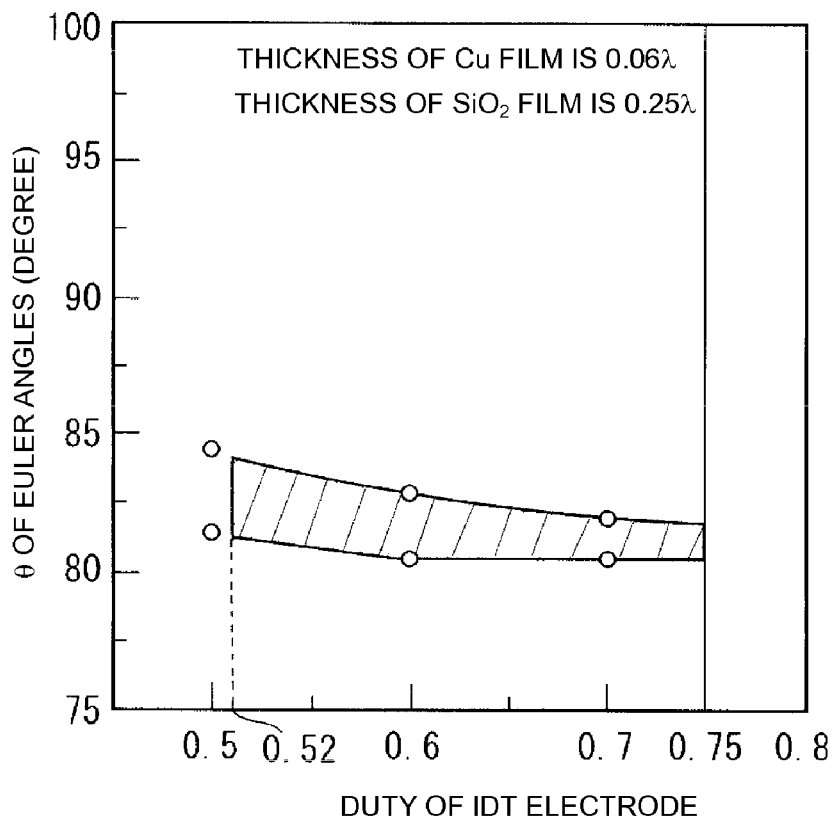
FIG. 6A is a view that, in a surface acoustic wave device including an IDT electrode made of Cu having a thickness of about 0.06λ and first and second silicon oxide films that are provided on an LiNbO$_3$ substrate having Euler angles (0°, θ, 0°), and the thickness of the second silicon oxide film being set to about 0.25λ, shows a relationship between θ of the Euler angles and the duty when the electromechanical coefficient $K_R^2$ of a Rayleigh wave that becomes a spurious response is about 0.04% or less.

FIG. 6A is a view that shows an area in which the electromechanical coefficient $K_R^2$ of a Rayleigh wave is about 0.04% or less in a structure in which, an IDT electrode made of a Cu film having a thickness of about 0.06λ and an $SiO_2$ film having substantially the same thickness are provided on an $LiNbO_3$ substrate having Euler angles (0°, θ, 0°), and then an $SiO_2$ film having a thickness of about 0.25λ is provided thereon. The area hatched with oblique lines in FIG. 6A is the area in which the electromechanical coefficient $K_R^2$ of a Rayleigh wave is about 0.04% or less. In addition, the line at a duty of about 0.75, extending vertically in FIG. 6A, shows an upper limit of the duty. When the duty is greater than or equal to the upper limit, it is difficult to manufacture the IDT electrode of the surface acoustic wave device.

Thus, from FIG. 6A, when the duty is between about 0.52 and about 0.75, and θ of the Euler angles is in the area hatched in FIG. 6A, it is possible to reduce the electromechanical coefficient $K_R^2$ of a Rayleigh wave that becomes a spurious response to about 0.04% or less. When the area hatched by oblique lines in FIG. 6A is expressed in Inequality, a value will be expressed by Inequality (2A) or (2B).

(1) when $0.52 \leq D \leq 0.6$, $(-10 \times D) + 86.5 \leq \theta \leq (37.5 \times D^2) - (57.75 \times D4) - 104.075$  Inequality (2A)

(2) when $D > 0.6$, $80.5 \leq \theta \leq (37.5 \times D^2)(-57.75 \times D) + 104.075$  Inequality (2B)

where D is a duty, and the thickness of the IDT electrode is 0.06λ.

Inequality (2A) or (2B) is a relationship that is established when the thickness of the IDT electrode made of Cu is about 0.06λ. Then, θ and the duty, at which the electromechanical coefficient $K_R^2$ of a Rayleigh wave is relatively small, vary depending on the thickness of the IDT electrode made of Cu. Then, when the duty is about 0.60 and the thickness of the $SiO_2$ film is about 0.25λ, θ that makes the electromechanical coefficient $K_R^2$ of a Rayleigh wave be about 0.04% or less was obtained when the thickness of the IDT electrode made of Cu was varied The results are shown in FIG. 6B.

Figure 6B:
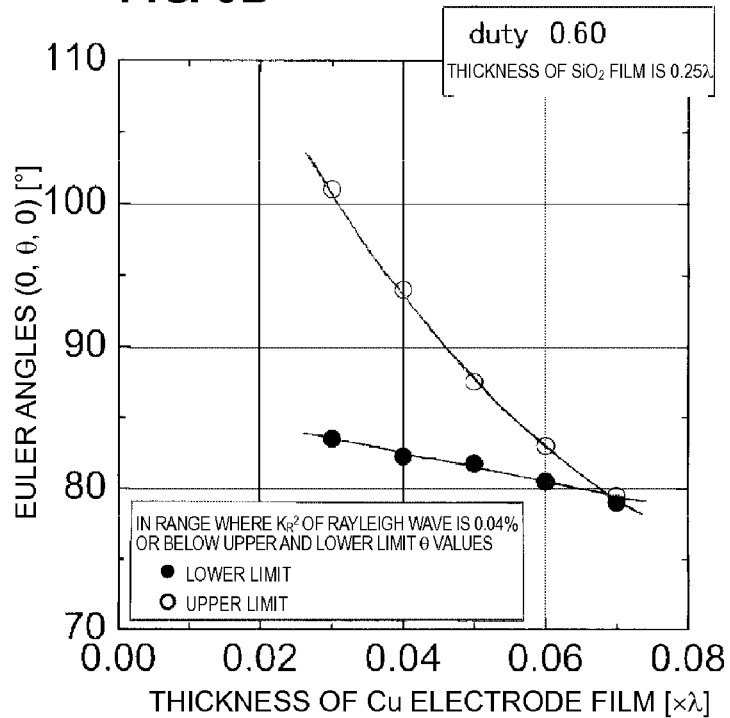
FIG. 6B is a view that, in a surface acoustic wave device including an IDT electrode made of Cu and first and second silicon oxide films that are provided on an LiNbO$_3$ substrate having Euler angles (0°, θ, 0°), the thickness of the second silicon oxide film being about 0.25λ, and the duty of the IDT electrode being about 0.60, shows a relationship between θ of the Euler angles and a thickness of a Cu electrode, which is the IDT electrode, when the electromechanical coefficient $K_R^2$ of a Rayleigh wave that becomes a spurious response is about 0.04% or less.

As shown in FIG. 6B, an area in which the electromechanical coefficient $K_R^2$ is about 0.04% or less depends on the thickness of the Cu electrode. Thus, due to the dependency on the thickness of the electrode, Inequality (2A) or (2B) may be expressed as in the case of Inequality (1A) or (1B).

Note that the relationship of Inequality (1A) or (1B) does not significantly change within the range in which the thickness of the second silicon oxide film is about 0.15λ to about 0.4λ. This will be described with reference to FIG. 7.

Figure 7:
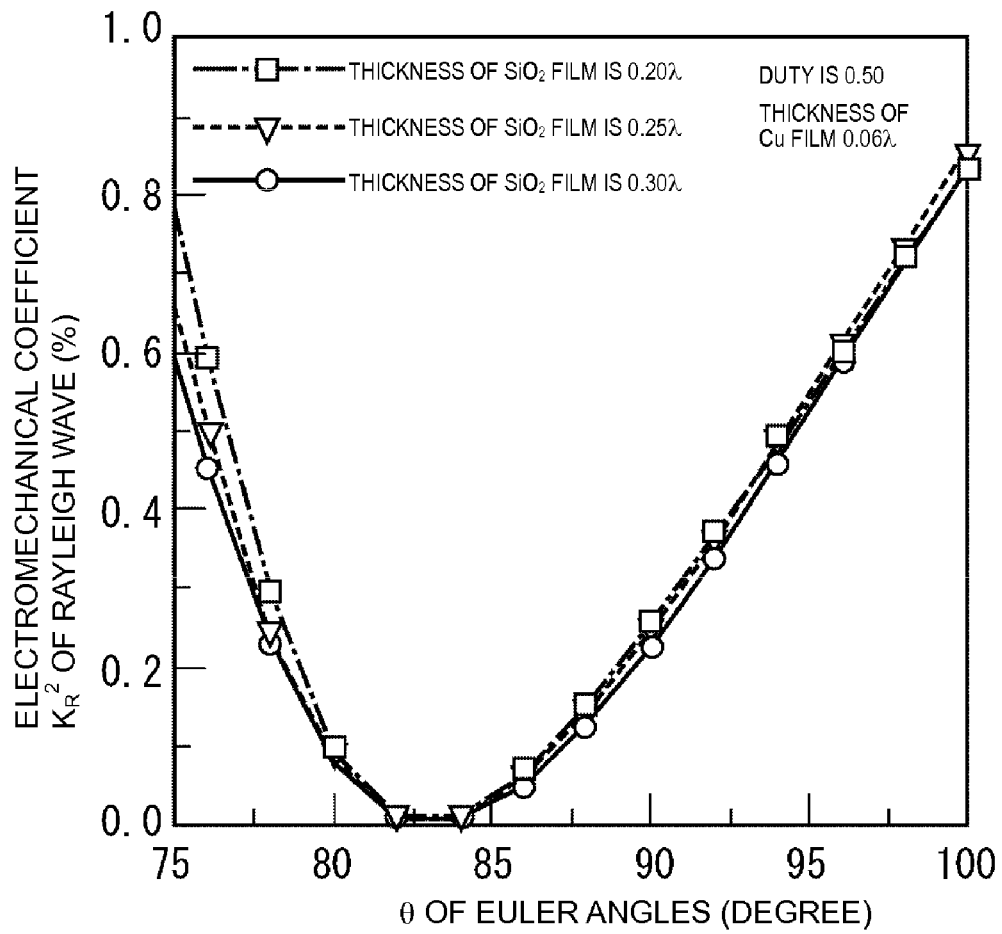
FIG. 7 is a view that, in a structure including an IDT electrode made of Cu having a thickness of about 0.06λ and a duty of about 0.50 that is provided on an LiNbO$_3$ substrate having Euler angles (0°, θ, 0°), shows a relationship among a thickness of the second silicon oxide film, θ of the Euler angles, and an electromechanical coefficient $K_R^2$ of a Rayleigh wave.
Figure 8:
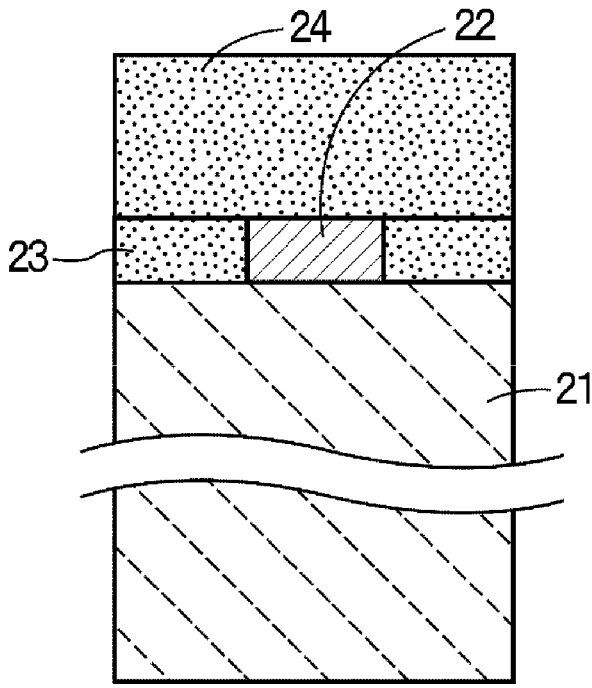
FIG. 8 is a view that shows a calculation model of a surface acoustic wave device that is assumed to obtain the results shown in FIG. 5 to FIG. 7.

FIG. 7 is a view that shows a relationship between θ of the Euler angles and an electromechanical coefficient $K_R^2$ of a Rayleigh wave when the thickness of the second silicon oxide film is set to 0.20λ, 0.25λ or 0.30λ for a structure including an IDT electrode made of Cu having a thickness of about 0.06λ is provided on an $LiNbO_3$ substrate having Euler angles (0°, θ, 0°) so as to have a duty of 0.50. As shown in FIG. 7, it appears that even when the thickness of the $SiO_2$ is varied within the range of about 0.20λ to about 0.30λ, a relationship between θ of the Euler angles and an electromechanical coefficient $K_R^2$ of a Rayleigh wave does not significantly change. An experiment conducted by the inventors of the present invention proved that even when the thickness of the $SiO_2$ film is varied within the range of about 0.15λ to about 0.40λ, similar to the results shown in FIG. 7, the relationship between the electromechanical coefficient $K_R^2$ of a Rayleigh wave and θ does not substantially change.

Note that according to preferred embodiments of the present invention, preferably, the thickness of the IDT electrode is set to be within the range of about 0.03λ to about 0.064λ, for example. That is, according to the above described Inequality (1A) or (1B), when the thickness of Cu is about 0.064λ, the upper limit and lower limit of θ are inverted. That is, when about 0.064λ is exceeded, there is no range in which the electromechanical coefficient $K_R^2$ of a Rayleigh wave is about 0.04% or less. Thus, the thickness of the IDT electrode is preferably about 0.064λ or less, for example.

In addition, when a spurious response of a Rayleigh wave is considered, as the thickness of the IDT electrode is reduced, the range in which the electromechanical coefficient $K_R^2$ of a Rayleigh wave is small expands. Thus, it is preferable as the thickness of the IDT electrode is reduced. However, if the thickness of the IDT electrode is too small, the acoustic velocity of a surface acoustic wave becomes greater than the acoustic velocity of a slow transverse wave. Thus, attenuation may possibly increase. Due to this point, the thickness of the IDT electrode is at least about 0.03λ, for example. Thus, the thickness of the IDT electrode primarily made of Cu is preferably in the range of about 0.03λ to about 0.064λ.

Next, an example in which a surface acoustic wave device was actually manufactured based on the above-described preferred embodiment of the present invention will be described.

A Y-rotated X-propagating $LiNbO_3$ substrate having Euler angles (0°, 81.5° to 84°, 0°) was prepared. An $SiO_2$ film was deposited on the $LiNbO_3$ substrate as a first silicon oxide film so as to have a thickness of about 107 nm (about 0.057λ). Then, a resist pattern was formed on the $SiO_2$ film, and the $SiO_2$ film was selectively etched through reactive ion etching (RIE) using the resist pattern to thereby form a groove. A Cu film was deposited so as to substantially fill the groove with Cu to thereby define an IDT electrode. After that, the Cu film other than the IDT electrode was removed together with the resist pattern through a lift-off method, for example, and a $SiO_2$ film having a thickness of about 460 nm (about 0.24λ) was deposited as a second silicon oxide film.

Furthermore, a SiN film was deposited on the uppermost portion in order to adjust the frequency, and the SiN film was etched to adjust the frequency. The thickness of the SiN film after frequency adjustment was about 15 nm.

Note that the frequency adjustment film may preferably be a SiC film, a Si film, or other suitable material other than the SiN film, or example.

In this manner, a one-port surface acoustic wave resonator having λ of about 1.89 μm, that is, a resonance frequency of about 1.9 GHz band, was manufactured.

Figure 9:
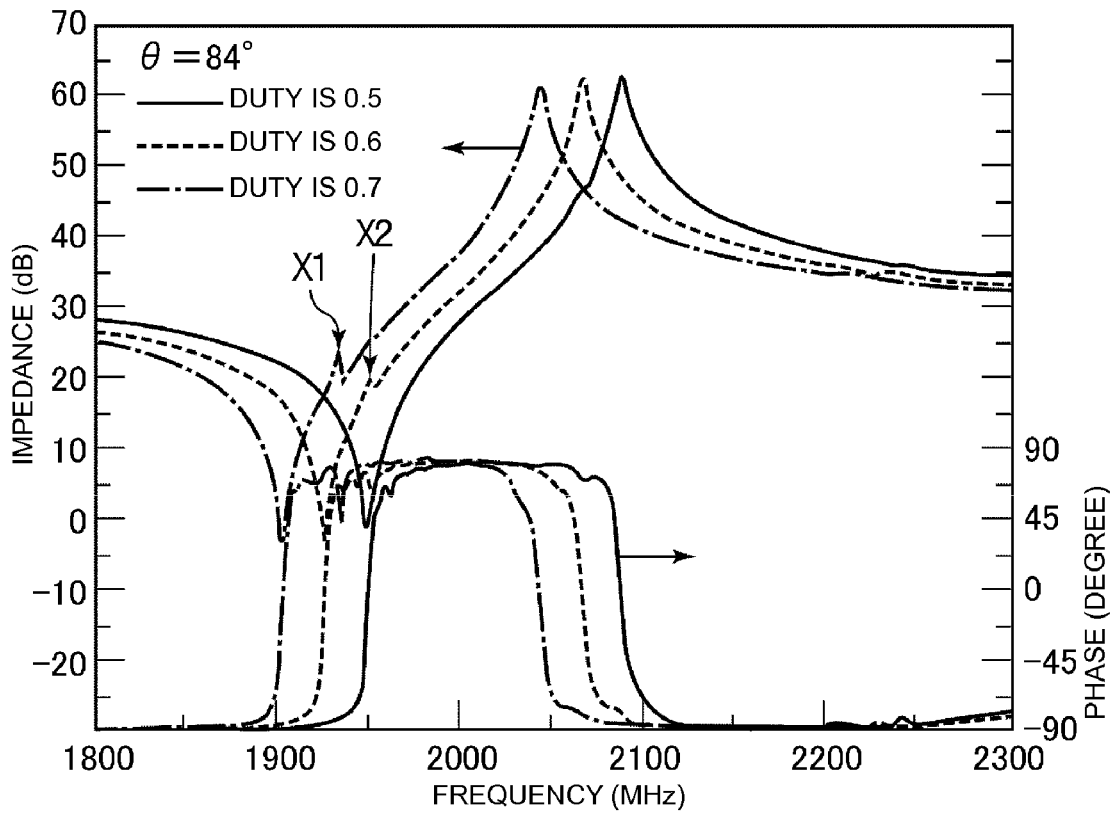
FIG. 9 is a view that shows the impedance-frequency characteristics and phase-frequency characteristics of a plurality of types of surface acoustic wave devices that are configured such that an IDT electrode having a duty of about 0.5, about 0.6, or about 0.7 is provided on an LiNbO$_3$ substrate having about 84° for θ of the Euler angles.
Figure 10:
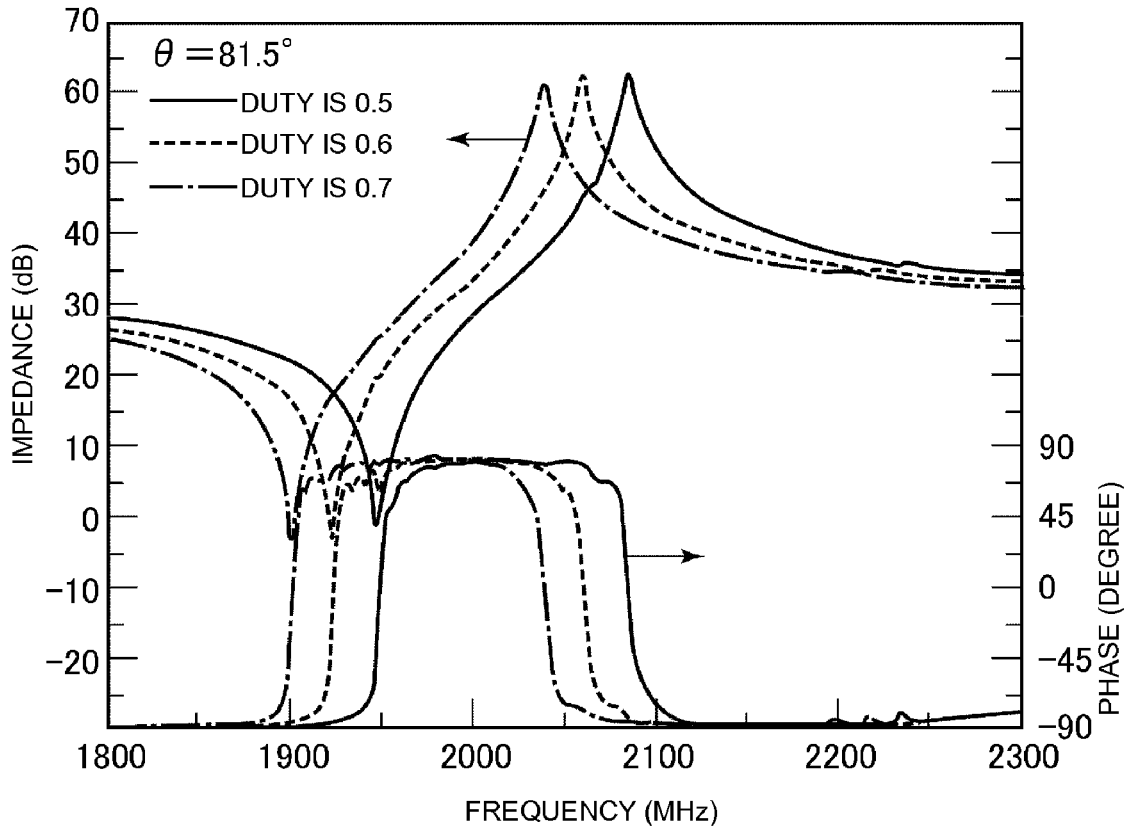
FIG. 10 is a view that shows the impedance-frequency characteristics and phase-frequency characteristics of a plurality of types of surface acoustic wave devices that are configured such that an IDT electrode having a duty of about 0.5, about 0.6, or about 0.7 is provided on an LiNbO$_3$ substrate having about 81.5° for θ of the Euler angles.

FIG. 9 and FIG. 10 show the impedance-frequency characteristic and phase-frequency characteristic of the one-port surface acoustic wave resonator obtained in the manner described above. FIG. 9 shows the results when θ of the Euler angles is about 84° and the duty of the IDT electrode is about 0.5, about 0.6, or about 0.7. FIG. 10 shows the characteristic when θ of the Euler angles is about 81.5° and the duty is about 0.5, about 0.6, or about 0.7.

As shown in FIG. 9, it appears that, when θ of the Euler angles is about 84°, a relatively large spurious response, which is not present when the duty is about 0.5, occurs as indicated by arrows X1 and X2 as the duty increases to about 0.6 or about 0.7.

In contrast, as shown in FIG. 10, it appears that, when θ of the Euler angles is about 81.5°, almost no spurious response occurs even when the duty is any one of about 0.5, about 0.6, or about 0.7. The above case in which the duty is about 0.6 or about 0.7 falls within the range in which the Inequality (1A) or (1B) is satisfied.

Note that the IDT electrode, as long as it is primarily made of Cu, may preferably be formed such that an adhesive layer, as a foundation film, is laminated on the lower surface of an electrode layer made of Cu or a protective layer is laminated on the upper surface of a main electrode layer. Furthermore, the main electrode layer need not be made of only Cu, and it may preferably be made of an alloy that primarily includes Cu, for example. In addition, a secondary metal film made of a metal other than Cu may preferably be laminated on an electrode film made of Cu or an alloy that primarily includes Cu, for example.

The Euler angles of the $LiNbO_3$ substrate are set to (0°, θ±5°, 0°) in the present preferred embodiment. However, according to the experiment of the inventors of the present invention, in the Euler angles (φ, θ, ψ), φ only needs to be within the range of 0°±5°, and ψ needs to be within the range of 0°±10°. In either case, it has been confirmed that similar advantageous effects to those of the preferred embodiments may be obtained.

Furthermore, the present invention is not limited to the one-port surface acoustic wave resonator or the band-pass filter portion of the duplexer described above, and may also be applied to various resonators or surface acoustic wave filters having various circuit configurations.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   an $LiNbO_3$ substrate having Euler angles (0°±5°, θ±5°, 0°±10°);
   an electrode provided on the $LiNbO_3$ substrate and including an IDT electrode primarily made of Cu;
   a first silicon oxide film provided in an area other than an area in which the electrode is arranged so as to have a thickness substantially equal to that of the electrode; and
   a second silicon oxide film arranged to cover the electrode and the first silicon oxide film; wherein
   the surface acoustic wave device utilizes an SH wave, wherein a duty D of the IDT electrode is at least about 0.52, and θ of the Euler angles (0°±5, θ±5°, 0°±10°) is set so as to fall within a range that satisfies the following Inequality (1A) or (1B):

(1) when $0.52 \leq D \leq 0.6$, $(-10 \times D)+92.5-(100 \times C) \leq \theta \leq (37.5 \times D^2)-(57.75 \times D)+104.075+(5710 \times C^2)-(1105.7 \times C)+45.729$     Inequality (1A)

(2) when $D>0.6$, $86.5-(100 \times C) \leq \theta \leq (37.5 \times D^2)-(57.75 \times D)+104.075+(5710 \times C^2)-1105.7\lambda C+45.729$     Inequality (1B)

where D is a duty, and C is a thickness of the IDT electrode normalized by a wavelength λ.

2. The surface acoustic wave device according to claim 1, wherein the electrode further includes reflectors disposed on opposite sides of the IDT electrode in a surface acoustic wave propagating direction in which a surface acoustic wave propagates.

3. The surface acoustic wave device according to claim 1, wherein the surface acoustic wave device is defined by a one-port surface acoustic wave resonator.

4. The surface acoustic wave device according to claim 1, wherein the IDT electrode has a thickness of about 108 nm.

5. The surface acoustic wave device according to claim 1, wherein the second silicon oxide film has a thickness of about 459 nm.

6. The surface acoustic wave device according to claim 1, further comprising a SiN film disposed on the second silicon oxide film.

7. The surface acoustic wave device according to claim 6, wherein the SiN film has a thickness of about 15 nm.

8. A duplexer comprising:
   an antenna-side input terminal
   a transmission filter including at least one surface acoustic wave device as recited in claim 1;
   a reception filter; wherein
   the transmission filter and the reception filter are connected to the antenna-side input terminal.

9. The duplexer according to claim 8, wherein the transmission filter includes a plurality of the surface acoustic wave devices as recited in claim 1.

* * * * *